US009046555B2

(12) United States Patent
Bucsa et al.

(10) Patent No.: US 9,046,555 B2
(45) Date of Patent: Jun. 2, 2015

(54) LATCHING OVER-CURRENT PROTECTION CIRCUIT AND METHOD

(75) Inventors: Andrei Bucsa, Toronto (CA); Stephen D. W. Fosty, Brampton (CA)

(73) Assignee: TYCO SAFETY PRODUCTS CANADA LTD., Concord (CA)

( * ) Notice: Subject to any disclaimer, the term of this patent is extended or adjusted under 35 U.S.C. 154(b) by 380 days.

(21) Appl. No.: 13/463,417

(22) Filed: May 3, 2012

(65) Prior Publication Data

US 2013/0154597 A1    Jun. 20, 2013

Related U.S. Application Data

(60) Provisional application No. 61/577,303, filed on Dec. 19, 2011.

(51) Int. Cl.

| G05F 1/56 | (2006.01) |
|---|---|
| G01R 19/00 | (2006.01) |
| G01R 23/02 | (2006.01) |
| G06F 17/00 | (2006.01) |
| H02H 3/087 | (2006.01) |
| H02J 7/00 | (2006.01) |
| H02H 3/06 | (2006.01) |

(52) U.S. Cl.
CPC ............... *G01R 23/02* (2013.01); *G01R 19/00* (2013.01); *G06F 17/00* (2013.01); *H02H 3/06* (2013.01); *H02H 3/087* (2013.01); *H02J 7/0068* (2013.01)

(58) Field of Classification Search
USPC ............ 363/16–19, 49, 50, 55, 56.01, 56.03, 363/97; 361/42, 53, 57, 100, 115, 93.1, 361/93.2, 93.5, 93.7, 93.9, 98; 323/222, 323/274–278, 282–288, 312–315
See application file for complete search history.

(56) References Cited

U.S. PATENT DOCUMENTS

| 4,791,314 | A  * | 12/1988 | Kuo et al. ...................... 326/32 |
|---|---|---|---|
| 6,617,913 | B1 * | 9/2003 | Johnson ........................ 327/423 |
| 6,804,102 | B2 * | 10/2004 | Hamon et al. ............... 361/93.3 |
| 6,861,832 | B2 * | 3/2005 | Perez ............................ 323/316 |
| 7,031,127 | B1 * | 4/2006 | D'Aquino et al. ............. 361/58 |
| 7,071,740 | B2 * | 7/2006 | Adams et al. ................ 327/110 |
| 7,149,098 | B1 * | 12/2006 | Chen ......................... 363/56.09 |
| 8,754,551 | B2 * | 6/2014 | Furuichi et al. ............... 307/126 |

\* cited by examiner

*Primary Examiner* — Rajnikant Patel

(57) ABSTRACT

A load limiting circuit includes a transistor switch, for providing current to a load and a latching circuit having a control input, and a latch output driving the transistor switch. A current sensing transistor interconnects with the transistor switch, to sense current in excess of a threshold to the load. The current sensing transistor drives the control input to the latching circuit. An external controller may drive and monitor the control input. The controller may thus turn the transistor switch on and off, and be notified of an over-current condition. The latching circuit may turn the transistor switch off permanently. As well, the controller may attempt to set the load limiting circuit after an over-current condition.

21 Claims, 2 Drawing Sheets

US 9,046,555 B2

LATCHING OVER-CURRENT PROTECTION CIRCUIT AND METHOD

CROSS-REFERENCE TO RELATED APPLICATIONS

The present application claims priority from U.S. Provisional Patent Application No. 61/577,303, filed Dec. 19, 2011 the contents of which are hereby incorporated by reference.

FIELD OF THE INVENTION

The present invention relates generally to electronic circuits and devices, and more particularly to a current limiting protection circuit whose state can be latched.

BACKGROUND OF THE INVENTION

Over-current protection for electrical loads is common place. To this end, transistor based current limiting circuits are well known.

In one such circuit, a transistor is used as a switch to switch current to a load. In the presence of a sensed over-current condition, a further transistor switch is turned on, in order to turn off the load current switching transistor. As explained below, as the load impedance, the voltage across the load current switching transistor increases in order to maintain a constant current. This requires the load current switching transistor to dissipate a large amount of power, which in turn, requires the load current switching transistor to have a high power rating and/or to be prone to failure.

Accordingly, there remains a need for a current limiting transistor circuit that requires the current switching transistor to dissipate less power.

SUMMARY OF THE INVENTION

In an embodiment, a load limiting circuit includes a transistor switch, for providing current to a load and a latching circuit having a control input, and a latch output driving the transistor switch. A current sensing transistor interconnects with the transistor switch, to sense current in excess of a threshold to the load. The current sensing transistor drives the control input to the latching circuit. An external controller may drive and monitor the control input. The controller may thus turn the transistor switch on and off, and be notified of an over-current condition. The latching circuit may turn the transistor switch off permanently limiting power dissipated by the transistor switch. As well, the controller may attempt to turn the load limiting circuit on again (by setting latching circuit 106) after an over-current condition.

In a further embodiment, a method of limiting current to a load, comprises providing a transistor switch, for providing the current to the load; providing a latching circuit to control a state of the transistor switch; sensing current provided by the transistor switch; latching the latching circuit to turn the transistor switch off, in the presence of the current exceeding a threshold.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

Figure 1:
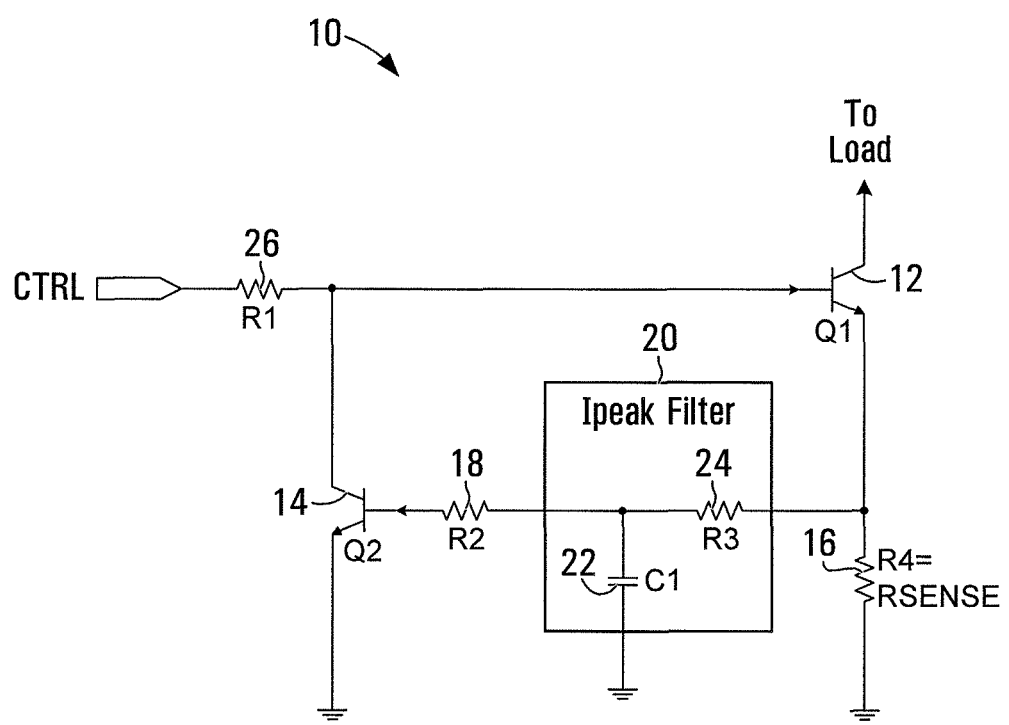
FIG. 1 is a schematic diagram of a conventional current limiting circuit.

FIG. 1 illustrates a conventional current limiting circuit 10 formed of two bipolar junction transistors (BJT) Q1 12, and Q2 14. A control input CTRL drives the base of Q1 12. Q1 12 acts to switch the load current. A resistor R4 16 connects the emitter of Q1 12 to ground. The node between the emitter of Q1 12 and R4 16 is interconnected to a filter 20 formed of C1 22 and R3 24. The output of filter 20 is interconnected to the base of Q2 14 by way of a resistor R2 18. Both Q1 12 and Q2 14 are configured as switches, or operating in their linear region, controlled by a voltage applied to their base in case of an over current condition.

A small control voltage (e.g. 3.3V—equivalent to a logic HI) may be applied to CTRL by an external controller, thereby applying a voltage to the base of Q1 12. If Q2 14 is off (high impedance between collector and emitter), this turns on Q1 12, and a load current from an external source is provided through the collector of Q1 12 to an external load (not shown). The voltage $V_{SENSE}$ across resistor R4 16 varies in proportion to the load current. If the load current exceeds a threshold, $V_{SENSE}$ will similarly exceed a threshold that, in turn, will begin turning on Q2 14 drawing current away from the base of Q1 12. As more current passes through R4 16, Q2 14 turns on more fully, drawing more current from the base of Q1 12 until an equilibrium is reached and current stops increasing through Q1 12. At this point, the voltage across Q1 12 could become high (depending upon the external supply voltage $V_{cc}$). This high voltage along with the limited Q1 12 current will cause Q1 12 to begin dissipating power.

$V_{SENSE}$ is filtered by filter 20 to remove ripple. A threshold may be chosen through appropriate choice of R3, R4 and R2. The current limit threshold may, for example, be calculated using a base to emitter voltage for Q2 14 of 0.65 v and the value of the current limit to calculate the value of R4 16.

Q2 14 serves to turn Q1 12 off. That is, once Q2 14 is on, Q1 12 is turned off, as the voltage at the base of Q1 12 will drop, cutting off current to the load. Circuit 10 does not completely turn off Q1 12. The negative feedback created by Q2 14, and the voltage across the base to emitter of Q2 14 creates a constant voltage across R4 16. Any increase in load current will be detected by R4 16 thus driving Q2 14 marginally harder in order to maintain the constant base to emitter voltage of Q2 14 across R4 16 therefore keeping the load current at a constant level.

The voltage applied to the load is now applied to Q1 12, increasing the collector to emitter voltage of Q1 12. As the collector to emitter voltage increases while constant current still flows to the load and Q1 12, power dissipation through Q1 12 becomes substantial. As such, the power rating of Q1 12 is generally quite high. Moreover, high power dissipation by Q1 12 can cause Q1 12 to fail, particularly in the absence of a suitable heat sink.

Figure 2:
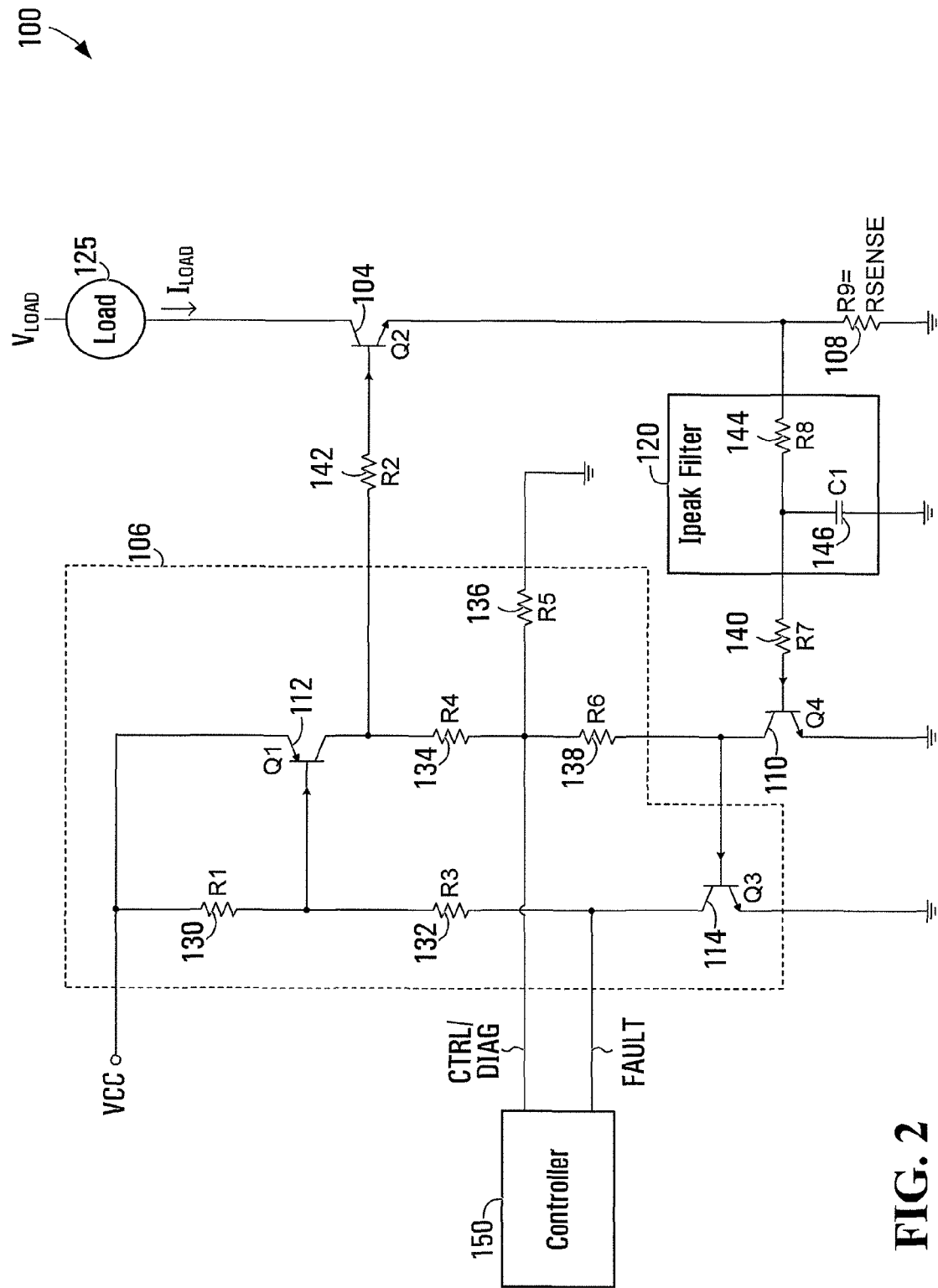
FIG. 2 is a simplified schematic block diagram of a current limiting circuit, exemplary of an embodiment of the present invention.

FIG. 2 illustrates a current limiting circuit 100, exemplary of an embodiment of the present invention. As illustrated, a load current ($I_{LOAD}$) is provided to a load 125 from an external voltage source (not shown) through a transistor Q2 104, acting as a load current switch. In the embodiment, Q2 104, is an NPN power BJT. A sense resistor R9 108 between ground and the emitter of Q2 104 presents a voltage proportional to $I_{LOAD}$.

The base of transistor Q4 110 is interconnected with the node presenting $V_{SENSE}$, by way of filter 120 (comprising R8 144 and C1 146) and resistor R7 140. The collector-emitter of transistor Q4 110 is switched on in the presence of an $I_{LOAD}$ in excess of a threshold. R9 108 sets the threshold based on base-emitter voltage of Q4. R7 140 limits the base current to Q4 110, and R8 144 also limits base current to Q4 110 and also is part of a current peak filter in order to provide some delay due to the RC time constant of R8 144 and C1 146 and the inrush current by way of Q2 104.

Q4 110 acts as a current sensing transistor that senses over-current to load 125 by way of R9 108.

Two additional transistors, Q1 112 and Q3 114, in combination with resistors R1 130, R3 132, R4 134, R5 136 and R6 138 form a latching circuit 106. Latching circuit 106 latches its output at the collector of Q1 112 in dependence on a control input CTRL/DIAG. The collector of Q1 112 provides the latch output of latching circuit 106 that drives the base of Q2 104, through R2 142 turning Q2 104 on or off, to switch current $I_{LOAD}$ to load 125. Latching circuit 106 may be reset (i.e. turned off) by turning Q3 114 off (high impedance).

In the depicted embodiment Q3 114 and Q4 110 are NPN BJTs. Q1 112 is a PNP BJT. Q1 112 and Q3 114 thus form a complementary latch.

The node between R4 134 and R6 138 provides a control input (CTRL/DIAG) to latching circuit 106. As will become apparent, the control input (CTRL/DIAG) may be pulsed from a high impedance state to a LO state to turn off Q3 114. As well, the control input may also be read/sampled to obtain the state output of latching circuit 106, and thus the state of the current through load 125. The collector of Q3 114 further provides a fault signal (FAULT output), that changes state with latching circuit 106.

Initially, after pulsing CTRL/DIAG and turning on Q2 104, CTRL/DIAG will be HI and the FAULT output will be LO. If latch circuit 106 is reset by an over-current condition or by pulsing CTRL/DIAG LO, CTRL/DIAG will indicate LO and the FAULT output will indicate HI. However, for a high reactive load, when the Q2 104 is turned ON a current swing which can temporarily exceed the maximum threshold current is possible. To avoid a possible unintended reset of latching 106 during this transient state, CTRL/DIAG may be switched from a high impedance state to HI level, and so maintained for a determined period of time, after it has been pushed back to high impedance. While CTRL/DIAG is kept HI during the transient state the FAULT output may be monitored. If the FAULT output oscillates, the load is likely highly reactive and the CTRL/DIAG may be kept HI until the transient state is finished or some time limit has expired.

A controller 150 in the form of a processor based controller, PLC, or other logic circuit may be used to operate latching circuit 106, and optionally monitor operation of latching circuit 106. In particular, the control input (CTRL/DIAG) may be interconnected to a control line of controller 150 that may be toggled by controller between a high-impedance state and logic low (LO) and high (HI), the FAULT output may similarly be connected to an interrupt (e.g. an IRQ line) or input (typically high impedance) on controller 150. As well, CTRL/DIAG may be interconnected to an input to controller 150. To this end, CTRL/DIAG may be connected to a bi-directional digital input/output line of controller 150, or to separate input and output lines by way of a multiplexer (not shown).

Controller 150 may be under software control, or may be a custom based logic circuit formed of one or more application specific integrated circuits, or conventional components, or a combination of a logic circuit, and a combination of software.

The software may include an interrupt service routine that responds to the IRQ line interconnected with the FAULT output, going HI.

In operation, a) On power-up of circuit 100, latching circuit 106 is off, that is—Q2 104 is off, Q1 112 is off, Q3 114 is off, and Q4 110 is off and no current flows to load 125.

b) To turn on Q2 104 and allow current to flow through load 125, controller 150 pulses CTRL/DIAG HI for a short interval—for example for about 10 ms, then returns to its high impedance state. This HI pulse turns on Q3 114 causing the collector of Q3 114 to go LO which in turn biases Q1 112 via R3 132 on, which in turn biases Q2 104 on via R2 142 and current will flow through load 125. The bias current that is applied to R2 142 is also applied to R4 134 and R6 138 to the base of Q3 114 keeping the collector of Q3 114 at ground. Latching circuit 106 is now latched on.

c) Controller 150 may now read the state of CTRL/DIAG. If latching circuit 106 is on, controller 150 will read a logic HI indicating that the load is turned on.

d) If CTRL/DIAG goes LO, controller 150 may note an over-current fault, and attempt to set latching circuit 106.

e) To attempt to set latching circuit 106, while having an overload condition, controller 150 pulses CTRL/DIAG HI for a longer period of time—for example between 10 ms and 20 ms. The interval selected to limit the amount of time an over-current may flow through Q2 104 that could damage resistor R9 108. R9 108 is thus chosen to be able to withstand a high current pulse for a short duration to allow the latching current to take effect. In any event, the HI pulse will turn on Q3 114 which pulls the collector of Q3 114 LO (FAULT output is now also LO). This turns on Q1 112 and applies $V_{cc}$ to the base of Q2 104 via R2 142. Current now flows through from collector to emitter of Q2 104 and applies the load current to load 125 through R9 108. The voltage across R9 108 (due to the overload current) is detected by Q4 110 and Q4 110 turns on, grounding the base of Q3 114 via the collector of Q4 110. This closed loop causes a short LO to HI pulse to be generated at the FAULT output (and detected by controller 150 interrupt input) as the latch self resets due to the continued over-current condition. Thus, controller 150 will maintain base bias of Q2 104 through R4 134 and R2 142 and Q2 104 will remain on (even if latching circuit 106 was reset by an over load condition). If the HI on FAULT output persists for a determined interval—for example between 10 ms and 20 ms, chosen in dependence of the load 125—controller 150 may turn latching circuit 106 off, by pulsing CTRL/DIAG LO.

f) To turn off Q2 104 and switch off current $I_{LOAD}$ to load 125, controller 150 may pulse CTRL/DIAG LO, for example for 10 mS, and then return to a high impedance state. This causes R6 138 to be pulled to ground, thus turning off Q3 114 which in turn removes the base bias current from Q1 112 and turns off Q1 112. This, in turn, removes base bias current to Q2 104 from R2 142 and at the same time removes base bias current from R6 138 to Q3 114, keeping Q3 114 off. R5 136 ensures that Q3 114 remains off.

Optionally, CTRL/DIAG can be pulsed HI from time-to-time without monitoring the status of CTR/DIAG (i.e. regardless of load voltage). If $I_{LOAD}$ is less than the current threshold, Q2 104 will simply remain ON. If $I_{LOAD}$ has exceeded the current threshold (due to a short) Q2 104 will automatically be disconnected. The fast response of circuit 100 minimizes power dissipation of Q2 104 because the threshold current is achieved when the voltage drop across Q2 104 is still at the collector-emitter saturation current (very low) so the peak power will remain low during the pulse cycle. Between pulses, power dissipated by Q2 104 will be zero (or near zero) and a short can be held indefinitely without damaging the circuit and with minimal power dissipation.

Latching circuit 106 is very fast, controllable and does not need an external supervisory circuit (such as controller 150). The peak power dissipated by Q2 104 will not exceed the product of the output transistor saturation voltage and the threshold current. A lower power rated transistor can thus be used as Q2 104.

Controller 150 can optionally read the status of circuit 100 from time to time. If current to load 125 is disconnected, controller 150 can try to reconnect the load, as described above. Alternatively, the controller may pulse CTRL/DIAG from time-to-time, without any readings as described above.

Example components for circuit 100 of FIG. 2, may include MMBT4403 (Q1); MMBT4401 (Q3, Q4); R1=100KΩ, R2=2.2KΩ, R3=10KΩ, R4=1KΩ; R5=100KΩ; R6=47KΩ; R7=100Ω; R8=1KΩ; C1=1 µF.

Conveniently, latching circuit 106 in combination with controller 150 allows for quicker, more effective limiting of current to an external load. Likewise, latching circuit 106 limits power dissipated by transistor Q2 104, acting as a load current switch of circuit 100.

Advantageously, circuit 100 only requires two additional transistors more than conventional current limiting circuit 10 (FIG. 1). A single input CTRL/DIAG may be used to both monitor and control circuit 100.

As will be appreciated, while the above described embodiments have been described in the context of BJT transistors, a similar circuit could be formed with field effect transistors (FETs), or a combination of BJTs and FETs. Likewise, latching circuit 106 could be formed in many other ways, possibly using more transistors, or for example using logic gates.

In alternate embodiments, a comparator may be used in place of Q4 110 to sense the voltage across R9 108 to adjust the current trip threshold.

In other embodiments, in order to keep power dissipation of the sense resistor low, an amplifier, such as an operational amplifier, may be used to amplify the sensed voltage across R9 108. The amplified sensed voltage may be applied to a comparator and the output of the comparator may be connected to the base of Q3 114. Q4 110 and associated circuitry could be eliminated.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. A current limiting circuit comprising:
   a transistor switch, for providing current to a load;
   a latching circuit having a control input, and a latch output;
   a current sensing transistor, interconnected with said transistor switch, to sense overcurrent to said load in excess of a threshold;
   wherein said current sensing transistor drives said control input, and said latch output drives said transistor switch, to open said transistor switch in the presence of an overcurrent to said load in excess of said threshold, and thereby protect said load from overcurrent.

2. The circuit of claim 1, wherein said latching circuit is a complementary latch.

3. The circuit of claim 2, wherein said complementary latch comprises a BJT pair.

4. The circuit of claim 1, wherein said latching circuit provides a fault signal, indicative of a current in excess of said threshold to said load.

5. The circuit of claim 1, wherein said latching circuit comprises an NPN transistor and a PNP transistor.

6. The circuit of claim 1, further comprising a filter between said current sensing transistor and said transistor switch.

7. The circuit of claim 1, wherein said transistor switch comprises a BJT.

8. The circuit of claim 6, wherein said transistor switch, when on, allows current to flow from its collector to emitter.

9. The circuit of claim 8, wherein said latch output drives a base of said transistor switch.

10. The circuit of claim 1, further comprising a controller to control operation of said latching circuit through said control input.

11. The circuit of claim 10, wherein said latching circuit comprises a state output providing a signal indicative of a state of a latch.

12. The circuit of claim 11, wherein said control input also provides said state output.

13. The circuit of claim 12, wherein said controller monitors said state output to detect over-current to said load.

14. The circuit of claim 10, wherein said latching circuit provides a fault signal, indicative of a current in excess of said threshold to said load and wherein said fault signal is interconnected with an interrupt line of said controller.

15. The circuit of claim 14, further comprising a persistent computer readable medium storing controller executable instructions that cause said controller to set said latching circuit after detecting an over-current condition.

16. The circuit of claim 15, wherein said controller monitors said fault signal as it keeps said latching circuit on to prevent said latching circuit reverting to an off state.

17. A method of limiting current to a load, comprising:
   providing a transistor switch, for providing said current to said load;
   providing a latching circuit to control a state of said transistor switch;
   sensing current provided by said transistor switch;
   latching said latching circuit to turn said transistor switch off, in the presence of said current exceeding a threshold to open said transistor switch in the presence of an over-current to said load in excess of said threshold, and thereby protect said load from said overcurrent.

18. The method of claim 17, further comprising setting said latching circuit to turn said transistor switch on, and concurrently monitoring said latching circuit to determine if current in excess of said threshold is provided to said load.

19. The method of claim 18, further comprising latching said latching circuit to turn said transistor switch off if current in excess of said threshold is provided to said load for a determined interval.

20. The circuit of claim 10, wherein said controller sets said latching circuit to turn said transistor switch on, and concurrently monitor said latching circuit to determine if current in excess of said threshold is provided to said load.

21. The circuit of claim 20, wherein said controller further latches said latching circuit to turn said transistor switch off if current in excess of said threshold is provided to said load for a determined interval.

* * * * *